United States Patent [19]

Duhl et al.

[11] Patent Number: 4,801,513

[45] Date of Patent: Jan. 31, 1989

[54] MINOR ELEMENT ADDITIONS TO SINGLE CRYSTALS FOR IMPROVED OXIDATION RESISTANCE

[75] Inventor: David N. Duhl, Newington, Conn.; Frederick A. Schwizer, Clinton, N.Y.

[73] Assignee: United Technologies Corporation, Hartford, Conn.

[21] Appl. No.: 661,492

[22] Filed: Oct. 16, 1984

Related U.S. Application Data

[63] Continuation-in-part of Ser. No. 301,802, Sep. 14, 1981, abandoned.

[51] Int. Cl.[4] .............................................. B32B 15/01
[52] U.S. Cl. .................................. 428/678; 148/404; 428/680
[58] Field of Search ........ 148/404, 409, 410, 426–429; 428/678, 680

[56] References Cited

U.S. PATENT DOCUMENTS 4,116,723  9/1978  Gell et al. ............................ 148/404

Primary Examiner—R. Dean

[57] ABSTRACT

The additions of minor additions of hafnium and silicon and mixtures thereof to nickel base superalloy single crystal articles provide significantly improved oxidation resistance. The oxidation resistance is improved both for the case of uncoated articles and in the case where a protective coating such as for example, a MCrAlY coated is present. For example the addition of 0.1% hafnium is observed to improve the oxidation resistance by a factor of 4 at 2100° F. and a similar addition improved the coating oxidation resistance by a factor of about 2.5 at 2150° F.

2 Claims, 3 Drawing Sheets

MINOR ELEMENT ADDITIONS TO SINGLE CRYSTALS FOR IMPROVED OXIDATION RESISTANCE

This application is a continuation-in-part of application Ser. No. 301,802, filed Sept. 14, 1981, now abandoned.

DESCRIPTION

TECHNICAL FIELD

Nickel base superalloy single crystal articles are provided with enhanced oxidation resistance by the addition of 0.05–0.2% of a material selected from a group consisting of hafnium and silicon and mixtures thereof. Additions of these elements improved the oxidation resistance of the articles in both coated and uncoated form.

BACKGROUND ART

Nickel base superalloys are widely used in gas turbine engines. Originally such alloys were used in conventionally cast form consisting of many randomly oriented equiaxed grains. Substantial property improvements were obtained by a casting technique known as directional solidification which was initially used to produce columnar grain articles consisting of a multiplicity of elongated oriented grains whose axis of elongation is constrained to be parallel to the axis of maximum stress. A subsequent refinement permits the production of single crystal articles and these articles represent the state-of-the-art in superalloy technology. The present invention concerns the improvement of the oxidation resistance of single crystal superalloy articles through the addition of small amounts of hafnium and/or silicon.

Silicon is known as a constituent of superalloys and is shown for example in U.S. Pat. Nos. 2,621,122, 2,994,605, 3,005,704, 3,411,898 and 3,524,744. Such minor additions have, to our knowedge, been made only to alloys intended for use in equaxed form. We are unaware that silicon has even been intentionally added to single crystal nickel base superalloy articles.

Hafnium has also been used in nickel base superalloy articles although to a lesser extent. U.S. Pat. No. 3,005,705 suggests the use of 0.1–1.0% hafnium in a equiaxed alloy article. The benefit attributed to hafnium in this patent is improved hgh temperature mechanical properties and it does not appear that any improvement in oxidation resistance was recognized. Hafnium has also been widely used in directional solidification columnar grained alloys where it provides improved transverse grain boundary ductility. This is described for example in U.S. Pat. No. 3,677,747. Again, in this patent there is no discussion of enhanced oxidation resistance. We are unaware that small hafnium additions have ever been made to single crystals for any purpose and in fact it was previously thought that hafnium should be avoided in single crystal articles as discussed in U.S. Pat. No. 4,116,723.

DISCOSURE OF INVENTION

The present invention concerns the additions of from 0.05 to 0.2% of a material selected from a group consisting of hafnium, silicon and mixtures thereof to nickel base superalloy articles. The addition of hafnium and silicon in these levels can provide from 2–4X improvement in oxidation resistance. Improvement in oxidation resistance are observedin both coated and uncoated form. Other features and advantages will be apparent from the specification and claims and from the accompanying drawings.

BEST MODE FOR CARRYING OUT THE INVENTION

This invention concerns a method for substantially improving the oxidation resistance of nickel base single crystal superalloy articles in both uncoated and coated forms. The invention results from the discovery that small additions of silicon and hafnium to the substrate alloy can significantly increase the oxidation resistance of the article. This result is somewhat surprising and not predictable from the prior art since it was not formerly appreciated that the degree of protection provided by coatings employed on superalloy articles was so sensitive to the substrate alloy composition.

The essence of the present invention is the addition of from about 0.05 to about 0.2 weight percent of silicon or hafnium or mixtures thereof to nickel superalloy single crystal articles. Such single crystal articles will in general contain from 5 to 18% chromium, at least 5% of the material selected from the group consisting of aluminum and titanium with the provision that aluminum be present from a minimum of 2% to a maximum of 8% and the titanium be present in from a minimum of 1% to a maximum of 5%. Further, the alloy must contain at least 5% of an element selected from the group consisting of up to 10% molybdenum, up to 15% tungsten, up to 12% tantalum, up to 3% columbium, up to 7% rhenium and mixtures thereof with the balance being essentially nickel. Preferably the alloy contains greater than about 6% (by weight) of tantalum. The alloy may also contain up to about 12% by weight cobalt. This composition is generally presented in U.S. Pat. No. 4,116,723. This patent also suggests that up to 3.5% hafnium might be present. The present invention calls for the addition of from about 0.05 to 0.2% hafnium and the range suggested in the present invention is critical as will subsequently be demonstrated. The present invention was evaluated using a particular alloy denoted as Alloy 454 having a nominal composition of 10 weight percent chromium, 5% cobalt, 5% aluminum, 1.5% titanium, 12% tantalum, 4% tungsten, balance nickel. This single crystal alloy formulation is described in and claimed in U. S. Pat. No. 4,209,348 which is incorporated herein by reference. This single crystal composition has an outstanding combination of properties but is generally representative of a wide range of such compositions. Additions of 0.1%, 0.4, and 0.6 weight percent hafnium as well as additions of 0.1 and 0.3 weight percent silicon were made to this nominal alloy composition.

Figure 1:
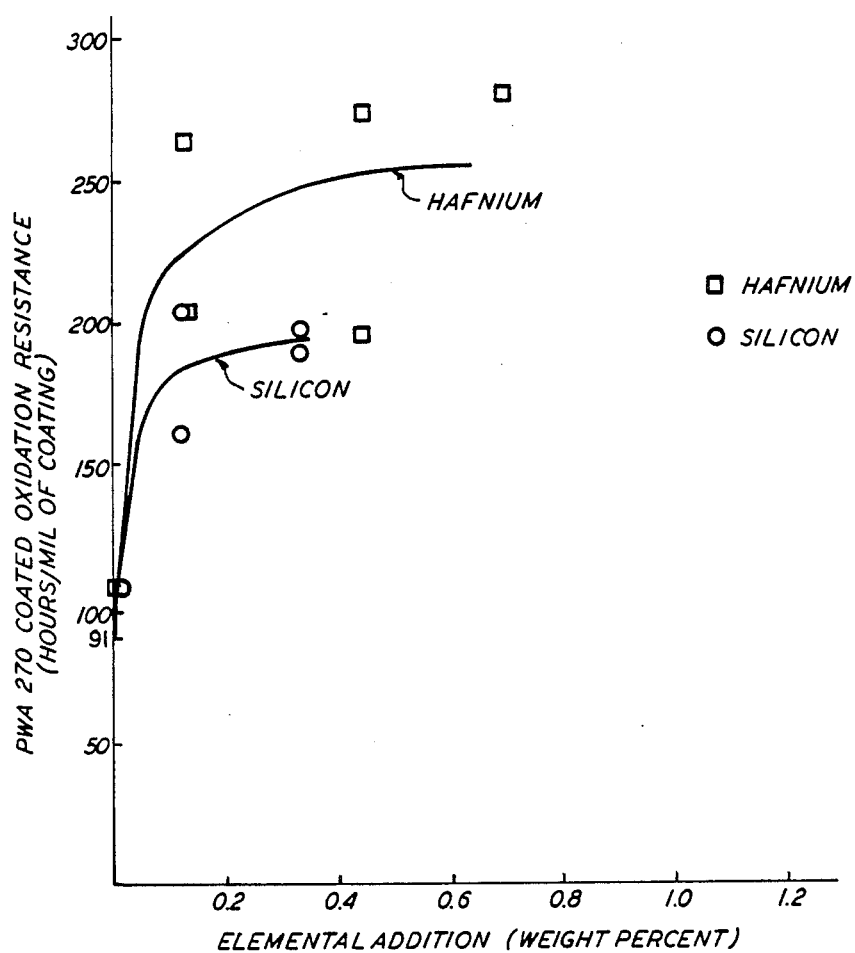
FIG. 1 shows the coated oxidation resistance of the single crystal article as a function of hafnium and silicon additions.

The resultant samples were tested under a variety of test conditions with the following results. FIG. 1 shows the effect of minor additions of silicon and hafnium on coated oxidation resistance of Alloy 454. In this instance the coating was a coating known as an overlay coating with a nominal composition of 22% cobalt, 20% chromium, 12% aluminum, and 0.8% yttrium. This is a NiCoCrAlY overlay coating and is described in some detail in U.S. Pat. No. 3,928,026. Overlay coatings typically contain 10–35% Cr, 8–25% Al, 0.1–1% Y balance selected from the group consisting of nickel and cobalt. Small additions of other elements including silicon, hafnium and tantalum may also be present. Overlay coatings are generally applied by vacuum vapor deposition process to produce a thin uniform adherent layer of the overlay coating alloy on the substrate surface. The data presented in FIG. 1 is the test time to penetration of the coating divided by the coating thickness. This type of measurement gives a relatively accurate indication of coating performance and eliminates coating thickness as a variable. From the figure it can be seen that the additions of small amounts of hafnium and silicon to the substrate composition have a marked effect on coated article life. The data in FIG. 1 are the result of testing at 2150° F. using a burner rig test. In this type of test, hot gases are generated by the combustion of jet fuel and these gases are impinged on the sample in test. The particular cycle employed included 29 minutes of exposure at 2150° F. followed by a 1 minute forced air cooling period. The purpose of the forced air cooling is to simulate the thermal fluctuations which occur during the operation of a gas turbine engine. From FIG. 1 it can be seen that the addition of about 0.1% silicon improves the coated oxidation life by about 90 or 100% while the addition of an equivalent amount of hafnium increases the coated oxidation life by about 150%. Hafnium is seen to be somewhat more effective than silicon in improving coated oxidation life and it is significant that with additions of both hafnium and silicon that no significant increase in oxidation resistance is provided by additions of more than about 0.2 weight percent of the element. From FIG. 1 the broad range of element additions can be set at from about 0.05 to about 0.2%.

The effects of small additions of hafnium and silicon on the uncoated oxidation resistance of single crystal articles are described in Table 1. Alloy 454 is the previous single crystal material. The table shows the effect of small additions of hafnium and silicon on the various parameters which are evaluated in oxidation testing. Both weight loss and maximum depth of penetration are substantially reduced by minor element additions. The column labeled oxidation resistance is determined by dividing the hours of testing into the maximum depth of penetration and the column labeled relative oxidation resistance compares the oxidation resistance of the various alloys to unmodified Alloy 454 material. From this latter column, it can be seen that additions of both hafnium and silicon significantly increase the uncoated oxidation resistance of the material. Hafnium appears to be more effective than silicon at the same level and additions of hafnium in the amount of 0.4 weight percent are substantially more effective than 0.1% hafnium additions. As has been seen, this latter effect is not observed in testing of coated oxidation resistance.

TABLE I

| | 2000° F. UNCOATED OXIDATION RESULTS | | | | |
|---|---|---|---|---|---|
| Alloy | Hours in Test | Weight Loss (Grams) | Maximum Depth of Penetration (mils/side) | Oxidation Resistance (hours/mil) | Relative Oxidation Resistance (X Alloy 454) |
| Alloy 454 | 503 | −1.42 | 17 | 29.6 | 1.0 |
| Alloy 454 + .1 wt. % Hf | 503 | −.12 | 4.3 | 117.0 | 4.0 |
| Alloy 454 + .4 wt. % Hf | 503 | −.10 | .7 | 718.6 | 24.3 |
| Alloy 454 + .1 wt. % Si | 503 | −.52 | 6.4 | 78.6 | 2.7 |

From the preceding discussion it appears that hafnium is more effective than silicon in improving the oxidation resistance of single crystal articles in both coated and uncoated form. It is also obvious that hafnium has less deleterious effects on mechanical properties (as shown in FIG. 3) and on incipient melting temperature (as shown in FIG. 2). For this reason hafnium is preferred over silicon.

Figure 2A:
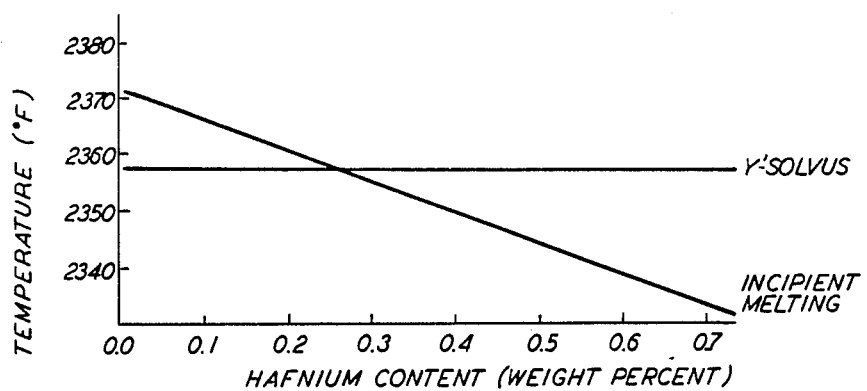
FIG. 2a and 2b show silicon additions on gamma prime solvus temperature and incipient melting temperature.
Figure 2B:
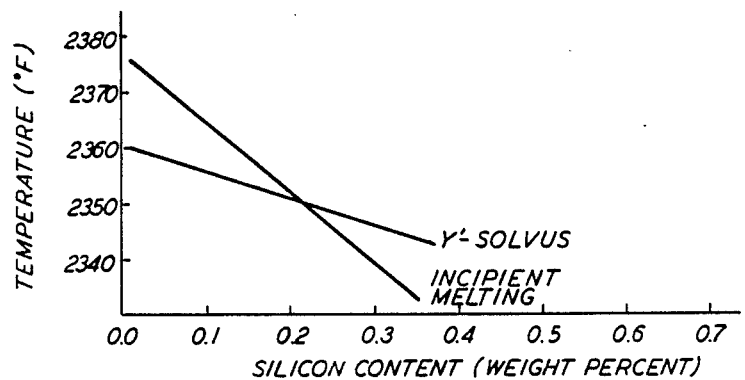

FIGS. 2a and 2b illustrate the effect of hafnium and silicon additions on the gamma prime solvus temperature and the incipient melting temperature of the substrate alloy. The gamma prime solvus temperature of the alloy is that temperature which must be exceeded if the gamma prime strengthening phase is to be dissolved into solid solution. The gamma prime solvus temperature must be approached and preferably exceeded for effective heat treatment of nickel base superalloys. The incipient melting temperature is that temperature above which localized melting of the superalloy will occur. For optimum heat treating results the gamma prime solvus temperature must be exceeded while the incipient melting temperature should not be exceeded. Further, as a consequnce of the limitations of practical heat treating equipment, it is desirable that a temperature span of at least 10° F., and preferably a greater span, exist between the gamma prime solvus and the incipient melting point. In the case of single crystals it is not catastrophic if minor incipient melting occurs, but it is preferable to avoid incipient melting if possible. Turning now to FIG. 2a the effect of hafnium additions on the gamma prime solvus and incipient melting temperatures of Alloy 454 are shown and it can be seen that for hafnium additions in excess of about 0.25 weight percent the incipient temperature lies below the gamma prime solvus leading to an undesirable heat treating situation. A similar situation can be seen to exist in FIG. 2b with respect to silicon additions. The information presented in FIGS. 2a and 2b leads to the conclusion that additions of silicon and/or hafnium in excess of about 0.25% are deleterious from the standpoint of heat treatment capbility.

Figure 3A:
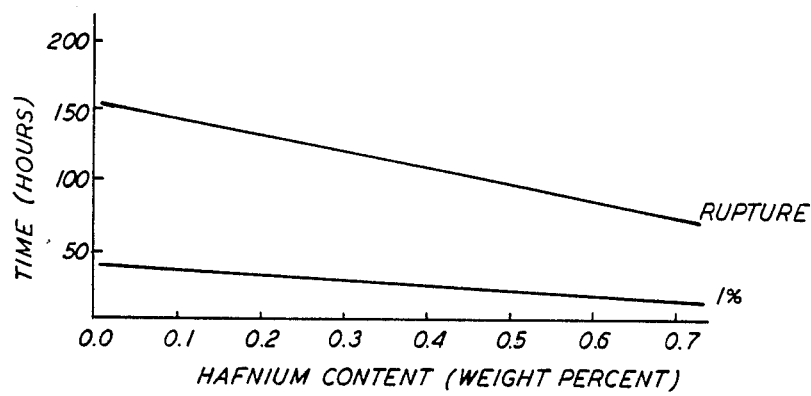
FIG. 3a and 3b show the effect of hafnium and silicon additions on rupture life and 1% creep life.
Figure 3B:
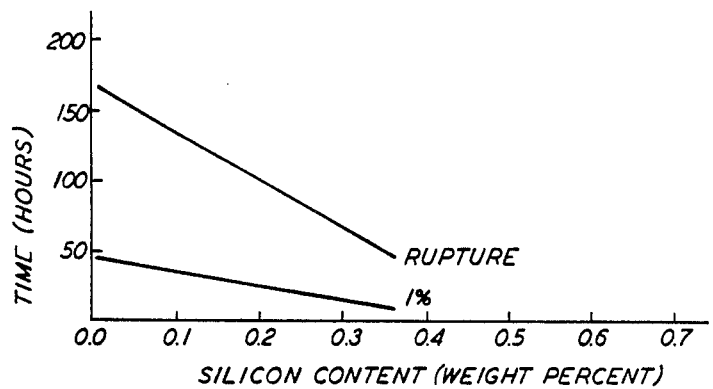

In metallurgy as in most highly developed art areas, it is unusual that a modification which improves one property will not have deleterious effect on other properties. This is the case in the present invention. FIGS. 3a and 3b show the effect of hafnium and silicon additions on the creep properties of Alloy 454. FIG. 3a shows that additions of small amounts of hafnium lead to the steady decrease in both the rupture life and the time to 1% creep for specimens tested at 1600° F. with an applied load of 70 ksi. FIG. 3b shows a similar effect on the creep properties of Alloy 454 as a consequence of additions of small amounts of silicon. However, it appears that small silicon additions have more of a deleterious effect on the creep properties than similar amounts of hafnium. The data presented in FIGS. 3a and 3b demonstrates another reason for limiting the silicon/hafnium additions to the lowest possible level consistent with the achievement of improved oxidation resistance.

While it has been suggested in the prior art that additions of various elements including hafnium and silicon to the overlay coating composition itself produces improvements in oxidation resistance, such prior art suggestions have to our knowledge been limited to the suggestion that the elements be added to the coating itself and further have generally suggested that element additions substantially in excess of those contemplated in the present invention be made. It appears that by making the addition of hafnium or silicon to the substrate alloy that the substrate thereby acts as a large reservoir of silicon and/or hafnium and that these elements diffuse into and through the coating and affect the oxidation process at the free surface of the coating. Because of the relatively large amounts of hafnium and silicon which are present in the total substrate, the diffusion through the coating can occur for long periods of time without significantly decreasing the effective amount of silicon and hafnium which is available. It is somewhat surprising, and unexpected, that these protective overlay coatings are so sensitive to the presence of silicon and hafnium in the substrate in such small amounts.

The overlay coatings derive their effectiveness from the development of a thin adherent scale of aluminum oxide on the free surface. It appears that the improvement in coated oxidation life results from some modification of this aluminum oxide layer by the silicon and hafnium in the substrate. The other significant type of protective coating employed on superalloys is that referred to as aluminide coatings. Such coatings are produced by the diffusion of aluminum into the superalloy surface to produce a modified surface layer relatively rich in aluminum. This aluminum rich surface layer develops an oxide on its free surface which protects the coated part in a manner similar to that of the protection derived by the overlay coatings. In view of this it is fully expected that additions of silicon and hafnium to the substrate will produce a similar improvement in coated oxidation resistance of parts of superalloy single crystals which have been given a protective aluminide coating.

Finally, although the invention has been extensively investigated with regard to an alloy known as Alloy 454, this alloy is representative of many other single crystal alloys and it is anticipated that similar results will be obtained on other alloys. Another alloy containing lesser amounts of tantalum and greater amounts of tungsten was also tested with and without the addition of 0.1% hafnium and an improvement of oxidation life of about 70% was obtained. This tends to confirm the belief that the effect of silicon and hafnium will be generally observed in nickel base superalloys of the type previously described.

It should be understood that the invention is not limited to the particular embodiments shown and described herein, but that various changes and modifications may be made without departing from the spirit and scope of this novel concept as defined by the following claims.

We claim:

1. A single crystal article consisting essentially of 5–18% chromium, at least 5% of the material selected from the group consisting of aluminum and titanium with the aluminum contents ranging from 2% to 8% and titanium contents ranging from 1–5%, at least 5% of the material selected from the group consisting of up to 10% Mo, up to 15% W, up to 12% Ta, up to 3% Cb, up to 7% Re, from 0.05 to 0.2% silicon, balance essentially nickel.

2. A coated single crystal article hving enhanced oxidation resistance consisting of a nickel superalloy substrate consisting of 5–18% chromium, up to 12 % cobalt, at least 5% of the material selected from the group consisting of aluminum and titanium with the aluminum contents ranging from 2% to 8% and titanium content ranging from 1–5%, at least 5% of the material selected from the group consisting of up to 10% Mo, up to 15% W, up to 12% Ta, up to 3% Cb, up to 7% Re, which further contains from 0.05 to 0.2% silicon, balance essentially nickel, said substrate having a coating thereon consisting of 10–35% chromium, 8–25% aliminum, 0.1–1.0% yttrium balance selected from the group consisting of nickel, cobalt and mixtures thereof.

* * * * *